United States Patent
Schrama

(10) Patent No.: US 11,417,806 B2
(45) Date of Patent: *Aug. 16, 2022

(54) DIELECTRIC MIRROR FOR BROADBAND IR LEDS

(71) Applicant: Lumileds LLC, San Jose, CA (US)

(72) Inventor: Charles Schrama, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/370,176

(22) Filed: Mar. 29, 2019

(65) Prior Publication Data

US 2020/0035869 A1 Jan. 30, 2020

Related U.S. Application Data

(63) Continuation-in-part of application No. 16/049,519, filed on Jul. 30, 2018, now abandoned.

(51) Int. Cl.
*H01L 33/50* (2010.01)
*H01L 33/60* (2010.01)

(52) U.S. Cl.
CPC .............. *H01L 33/50* (2013.01); *H01L 33/60* (2013.01)

(58) Field of Classification Search
CPC ......... H01L 33/50; H01L 33/60; H01L 33/46; H01L 33/504; H01L 33/06; H01L 33/44; H01L 33/508; H01L 33/502; H01L 33/58; H01L 33/486; H01L 33/505; H01L 33/507
USPC .......................................................... 257/98
See application file for complete search history.

(56) References Cited

U.S. PATENT DOCUMENTS

| | | | | |
|---|---|---|---|---|
| 5,469,233 A | * | 11/1995 | Katsuragi | A61B 3/152 351/205 |
| 7,250,715 B2 | * | 7/2007 | Mueller | C09K 11/0883 313/485 |
| 7,682,850 B2 | * | 3/2010 | Harbers | C09K 11/7774 438/25 |
| 8,283,686 B2 | * | 10/2012 | Jagt | H01L 33/46 257/98 |

(Continued)

FOREIGN PATENT DOCUMENTS

DE 102004002101 A1 5/2005

OTHER PUBLICATIONS

International Search Report and Written Opinion corresponding to PCT/US2019/044103, dated Oct. 15, 2019, 10 pages.

(Continued)

*Primary Examiner* — Khiem D Nguyen

(57) ABSTRACT

LED devices and methods of operating LED devices are described. An LED device includes a light-emitting element, a wavelength converting layer and a dichroic mirror. The light-emitting element is configured to emit ultra violet, visible, or ultra violet and visible light. The wavelength converting layer is configured to absorb at least a portion of the light emitted by the light-emitting element and in response emit infrared light. The dichroic mirror transmits the infrared light emitted by the wavelength converting layer, reflects the light emitted by the light emitting element, and is arranged to reflect back into the wavelength converting layer light emitted by the light emitting element, transmitted unabsorbed through the wavelength converting layer, and incident on the dichroic mirror.

20 Claims, 9 Drawing Sheets

(56) References Cited

U.S. PATENT DOCUMENTS

| | | | | |
|---|---|---|---|---|
| 8,575,642 B1* | 11/2013 | Shum | | H01L 33/44 257/98 |
| 9,099,626 B2* | 8/2015 | Ockenfuss | | H01L 33/60 |
| 9,214,616 B2* | 12/2015 | Livesay | | H01L 33/64 |
| 9,219,205 B2* | 12/2015 | Diana | | H01L 33/505 |
| 9,476,568 B2* | 10/2016 | Tao | | C09K 11/7733 |
| 2004/0129945 A1* | 7/2004 | Uemura | | H01L 33/507 257/98 |
| 2005/0205884 A1* | 9/2005 | Kim | | H01L 33/32 257/98 |
| 2008/0042153 A1* | 2/2008 | Beeson | | H05B 33/10 257/94 |
| 2008/0230795 A1* | 9/2008 | Dias | | H01L 33/504 257/98 |
| 2009/0027685 A1* | 1/2009 | Abe | | G01B 9/02085 356/477 |
| 2010/0320480 A1* | 12/2010 | Rapoport | | H01L 33/50 257/88 |
| 2011/0025190 A1* | 2/2011 | Jagt | | H01L 33/58 313/499 |
| 2011/0248296 A1* | 10/2011 | Choi | | H01L 33/504 257/89 |
| 2011/0254040 A1* | 10/2011 | Nagai | | H01L 25/0753 257/98 |
| 2012/0007130 A1* | 1/2012 | Hoelen | | H01L 33/504 257/98 |
| 2013/0293099 A1* | 11/2013 | Allen | | H01L 33/507 313/512 |
| 2015/0084500 A1* | 3/2015 | Ouderkirk | | H01L 33/60 313/512 |
| 2015/0243855 A1* | 8/2015 | Wilm | | H01L 33/508 257/98 |
| 2016/0064620 A1* | 3/2016 | Mastin | | H01L 33/507 257/88 |
| 2016/0079499 A1* | 3/2016 | Diana | | H01L 33/32 257/98 |
| 2016/0104820 A1* | 4/2016 | Lim | | C09K 11/7734 257/98 |
| 2016/0181490 A1* | 6/2016 | Chao | | H01L 33/46 257/98 |
| 2018/0019384 A1 | 1/2018 | Abe | | |

OTHER PUBLICATIONS

European Search Report corresponding to EP 18191774, dated Jan. 31, 2019, 1 page.

Extended European Search Report corresponding to EP18191774, dated Feb. 12, 2019, 7 pages.

* cited by examiner

DIELECTRIC MIRROR FOR BROADBAND IR LEDS

CROSS REFERENCE TO RELATED APPLICATION(S)

This application is a continuation-in-part of U.S. patent application Ser. No. 16/049,519, filed Jul. 30, 2018, which is incorporated by reference as if fully set forth.

BACKGROUND

A common method for analyzing the composition of organic substances is infrared (IR) radiation. IR radiation or near IR radiation excites vibrational modes in the material to be tested, resulting in the characteristic absorption bands. Current broadband IR light emitting diode (LED) devices comprise a light-emitting element, which emits UV and/or visible light, and a wavelength converting layer overlaying the light-emitting element to convert the UV and/or visible light into IR radiation.

SUMMARY

LED devices and methods of operating LED devices are described. An LED device includes a light-emitting element, a wavelength converting layer and a dichroic mirror. The light-emitting element is configured to emit ultra violet, visible, or ultra violet and visible light. The wavelength converting layer is configured to absorb at least a portion of the light emitted by the light-emitting element and in response emit infrared light. The dichroic mirror transmits the infrared light emitted by the wavelength converting layer, reflects the light emitted by the light emitting element, and is arranged to reflect back into the wavelength converting layer light emitted by the light emitting element, transmitted unabsorbed through the wavelength converting layer, and incident on the dichroic mirror.

DETAILED DESCRIPTION OF THE PREFERRED EMBODIMENTS

Figure 1:
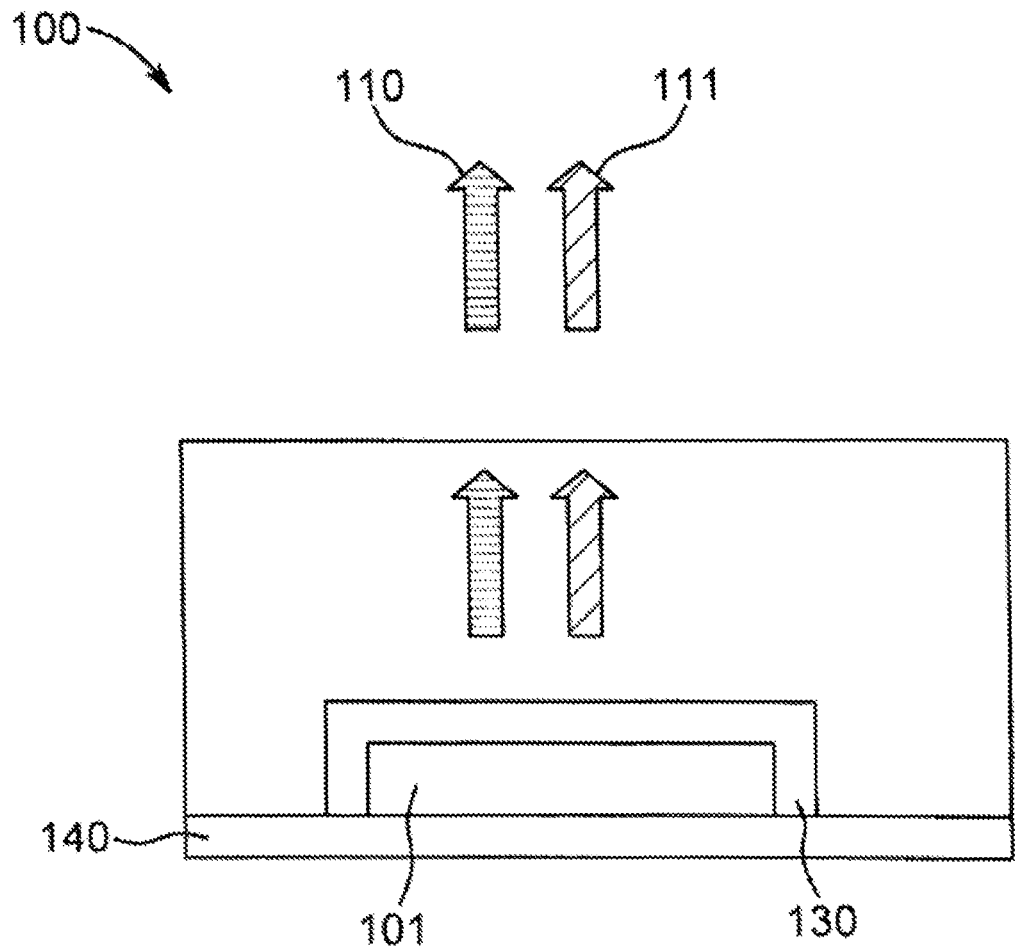
FIG. 1 is a sectional view of an LED device.

Examples of different light illumination systems and/or light emitting diode implementations will be described more fully hereinafter with reference to the accompanying drawings. These examples are not mutually exclusive, and features found in one example may be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, third, etc. may be used herein to describe various elements, these elements should not be limited by these terms. These terms may be used to distinguish one element from another. For example, a first element may be termed a second element and a second element may be termed a first element without departing from the scope of the present invention. As used herein, the term "and/or" may include any and all combinations of one or more of the associated listed items.

It will be understood that when an element such as a layer, region, or substrate is referred to as being "on" or extending "onto" another element, it may be directly on or extend directly onto the other element or intervening elements may also be present. In contrast, when an element is referred to as being "directly on" or extending "directly onto" another element, there may be no intervening elements present. It will also be understood that when an element is referred to as being "connected" or "coupled" to another element, it may be directly connected or coupled to the other element and/or connected or coupled to the other element via one or more intervening elements. In contrast, when an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper,", "lower," "horizontal" or "vertical" may be used herein to describe a relationship of one element, layer, or region to another element, layer, or region as illustrated in the figures. It will be understood that these terms are intended to encompass different orientations of the device in addition to the orientation depicted in the figures.

Broadband IR LEDs can be used in various applications, including but not limited to, IR spectroscopy and security cameras. In general, broadband IR LED devices comprise an a light-emitting active layer, which emits UV and/or visible light, and a wavelength converting layer overlaying the light-emitting active layer to convert the UV and/or visible light into IR radiation. However, the conversion of UV anchor visible light to IR radiation in these IR LED devices is relatively low due to a significant amount of the UV and/or visible light escaping from the LED device unconverted.

FIG. 1 illustrates an example LED device 100. The LED device 100 comprises a light-emitting element 101, a wavelength converting layer 130, and a substrate 140. The light-emitting element 101 is disposed on the substrate 140 and emits light within a first wavelength range 111 (commonly referred to as pump light). The first wavelength range may be within the ultraviolet (UV) and/or visible portions of the spectrum. For example, the first wavelength range may be 350-500 nm. The wavelength converting layer 130 overlays the light-emitting element 101 and converts the light within the first wavelength range 111 emitted from the light-emitting element 101 to light within a second wavelength range 110. The second wavelength range 110 may be higher than the first wavelength range 111. The second wavelength range may be within the IR portion of the spectrum. For example, the second wavelength range may be 600-2500 nm. However, light within the first wavelength range 111 may escape the LED device 100 unconverted along with the converted light 110, as illustrated in FIG. 1. This may result in unwanted UV and/or visible light to be present in the final application.

Figure 2:
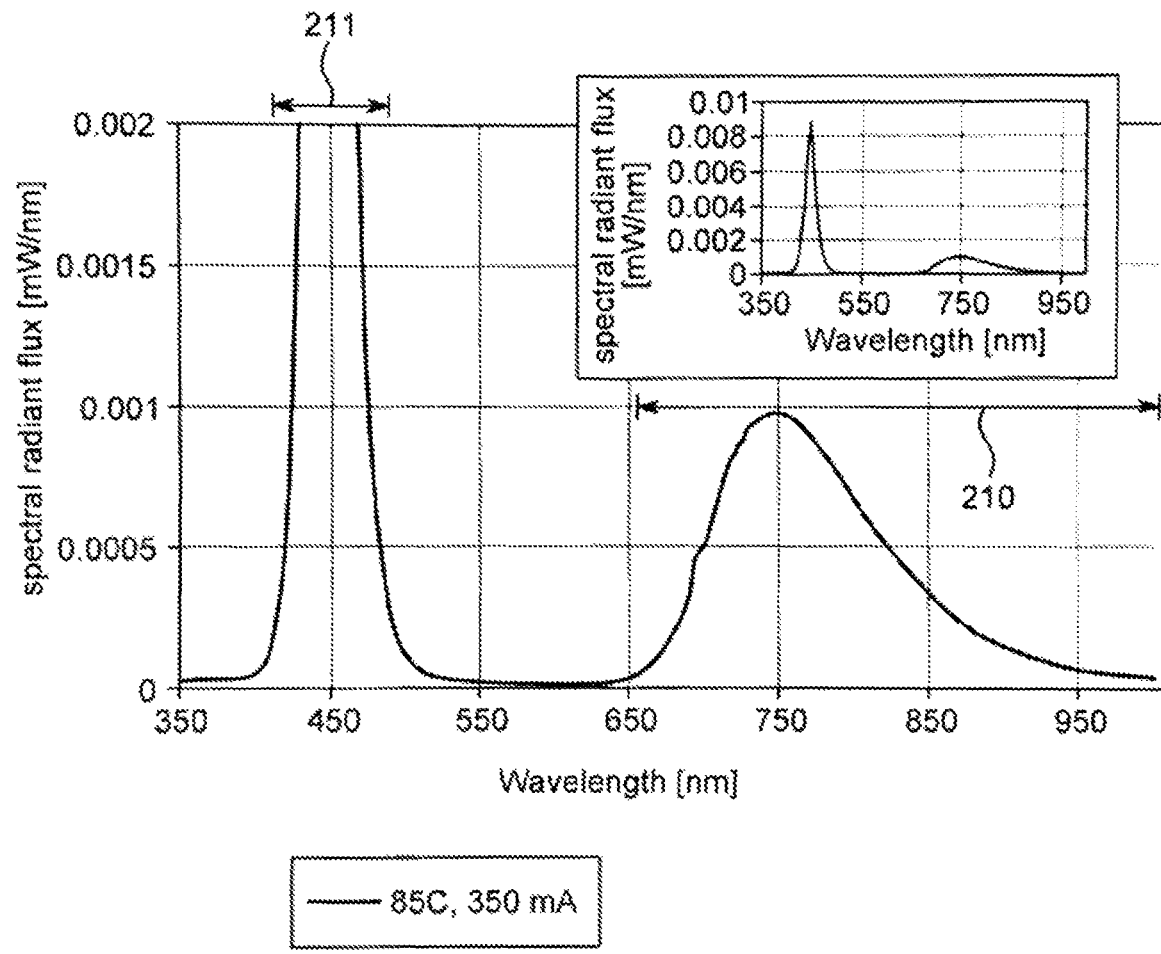
FIG. 2 is a graph showing the spectral radiant flux of light leaving the LED device of FIG. 1.

FIG. 2 is a graph showing the spectral radiant flux (mW/nm) of light leaving the LED device of FIG. 1. As illustrated in FIG. 2, a significant portion of light within a first wavelength range 211 of approximately 350-500 nm escapes the package unconverted and the amount of light within a second wavelength range 211 of approximately 650-1000 nm, i.e. converted light, is relatively low.

Dichroic mirrors are a type of dielectric mirror that can be designed to transmit particular wavelengths of visible light and/or optical power and reflect others. In embodiments described herein, a dichroic mirror design is described that may separate visible light (cold) and IR (warm) light such that only the visible light is reflected.

Figure 3A:
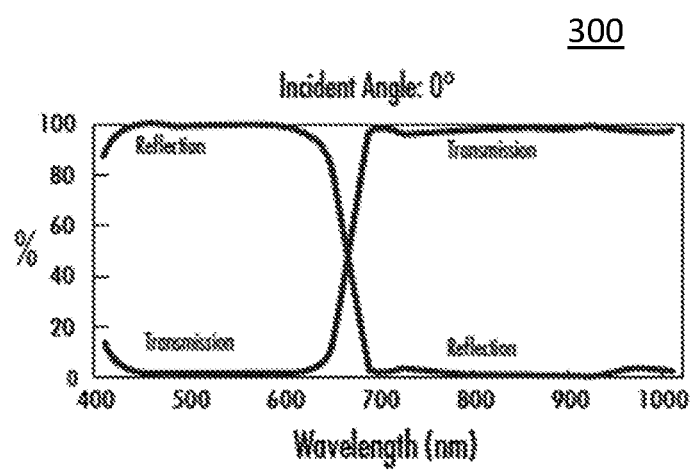
FIG. 3A is a graph showing properties for an example dichroic mirror according to an embodiment.

FIG. 3A is a graph 300 showing properties for an example dichroic mirror according to an embodiment. As can be seen in the example of FIG. 3, the dichroic mirror may reflect nearly all light having wavelengths between 400 nm and 650 nm and transmit nearly all light having wavelengths above 700 nm. LED devices are described herein that may use such a dichroic mirror to reflect unconverted UV and/or visible light emitted from the LED back into the device and, more specifically, back into the wavelength converting layer so that it may be fully converted into IR light before finally being emitted from the LED device. Specific examples of top and side-emitting LED devices are described herein. However, one of ordinary skill in the art will recognize that the dichroic mirror described herein may be used with any type of LED device. Further, while FIG. 3 shows specific properties for a dichroic mirror that is very effective at improving conversion efficiency of an IR LED, any dichroic mirror that reflects visible light and transmits IR light may be used consistent with the embodiments described herein.

Figure 3B:
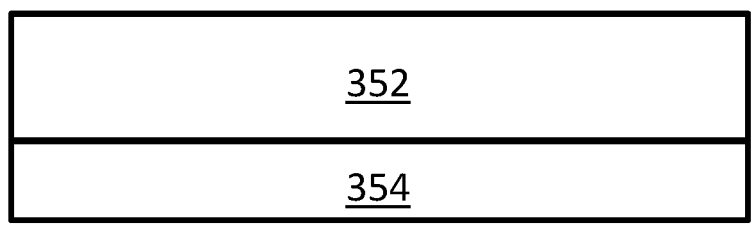
FIG. 3B is a sectional view of an example dichroic mirror.

FIG. 3B is a diagram of an example dichroic mirror 350. In embodiments, the dichroic mirror 350 may be a long pass dichroic mirror configured as a beam splitter. In the example illustrated in FIG. 3B, the dichroic mirror 350 is a two layer structure that includes a first layer 352 and a second layer 354. The first layer 352 may have a relatively low refractive index, and the second layer 352 may have a reflective high refractive index in comparison to the refractive index of the first layer 352. The refractive indices and thicknesses of the first and second layers 352 and 354 may be chosen such that the dichroic mirror 350 is highly reflective below a particular wavelength and high transmissive above that wavelength. In embodiments, the dichroic mirror 350 may be provided on a transparent substrate (not shown).

Figure 4:
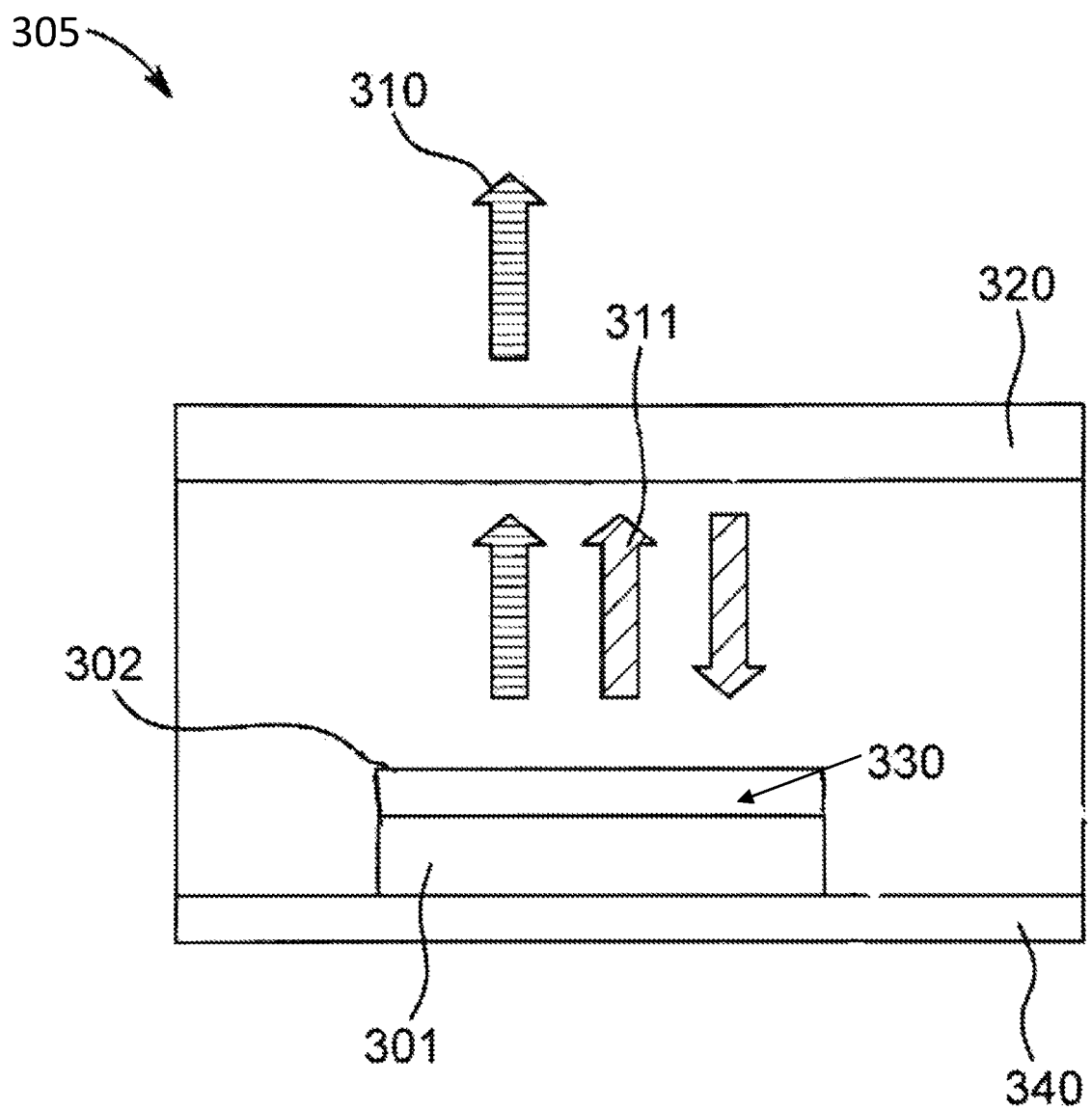
FIG. 4 is a sectional view of an example LED device that includes a dichroic mirror.
Figure 8:
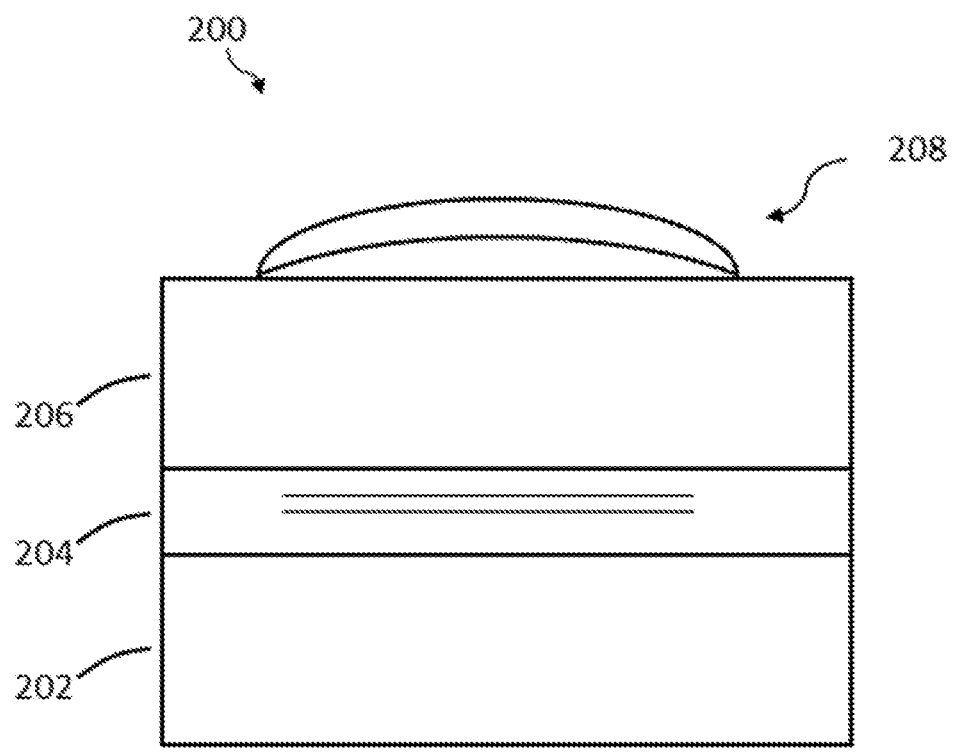
FIG. 8 is a diagram showing an example LED device in more detail.
Figure 9:
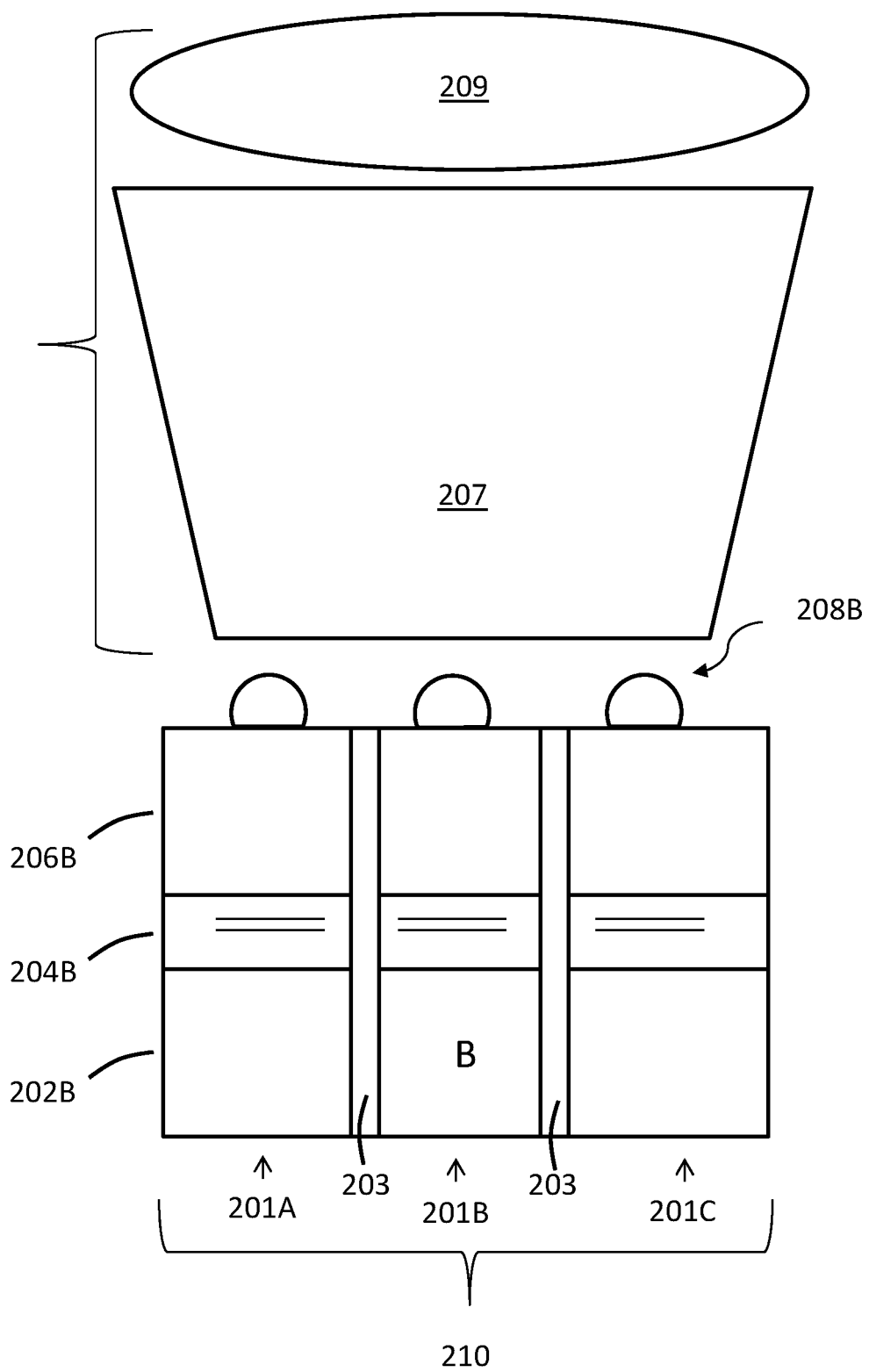
FIG. 9 is a diagram showing an example of multiple LED devices.

FIG. 4 illustrates an embodiment of an LED device 305 that includes a dichroic mirror, such as a dichroic mirror having properties such as provided in the graph of FIG. 3A. The LED device 305 comprises a light-emitting element 301, a wavelength converting layer 330, a substrate 340, and a dichroic mirror 320. FIGS. 8 and 9 below provide a more detailed example of a structure of an LED device. With reference to FIG. 8, the light emitting element 301 includes the active layer 204 and may also include one or more additional elements, such as the substrate 202 and any associated contacts and/or other conductive elements for electrically coupling the light-emitting element to or through the support substrate 340 to receive a current.

The light-emitting element 301 is provided on a support substrate 340. The light-emitting element 301 emits light within a first wavelength range 311. In one embodiment, the first wavelength range 311 is within the UV and/or visible portions of the spectrum. In a further embodiment, the first wavelength range 311 is approximately 350-500 nm. In a further embodiment, the light-emitting element 301 emits blue pump light.

In the example illustrated in FIG. 4, the wavelength converting layer 330 is disposed over the light-emitting element 301. The wavelength converting layer 330 is configured to convert light within the first wavelength range 311 to light within a second wavelength range 310. The second wavelength range 310 is higher than the first wavelength range 311. In one embodiment, the second wavelength range 310 is within the IR portion of the spectrum. For example, in an embodiment where the first wavelength range 311 is approximately 350-500 nm, the second wavelength range 310 may be approximately 600-2500 nm, which is within the IR portion of the spectrum.

The LED device 305 further comprises at least one dichroic mirror 320. The at least one dichroic mirror 320 is configured to reflect light within the first wavelength range 311 and transmit light within the second wavelength range 310. For example, in an embodiment where the first wavelength range 311 is approximately 350-500 nm and the second wavelength range 310 is approximately 600-2500 nm, the dichroic mirror 320 reflects light having a wavelength of approximately 350-500 nm and transmits light having a wavelength of approximately 600-2500 nm.

The at least one dichroic mirror 320 is placed over the LED device 305 and is designed to reflect light within the first wavelength range back into the LED device 300. As such, the unconverted light will not escape from the package but may instead be recycled back into the wavelength converting layer for conversion. Light within the second wavelength range 310 is able to escape from the package, since the dichroic mirror 320 transmits light within the second wavelength range 310.

The embodiment illustrated in FIG. 4 is a top emitting LED device wherein nearly all of the light that is emitted from the light-emitting element 301 is emitted through a top surface 302. In this embodiment, the dielectric mirror 320 is placed over the top surface 302. As such, the light within the first wavelength range 311 and the light within the second wavelength range 310 that is emitted from the top surface 302 interacts with the dichroic mirror 320. As illustrated in FIG. 4, the light within the first wavelength range 311 that is emitted from the light-emitting element 302 is reflected back into the LED device 301 and light within the second wavelength range 310 escapes from the LED device 301. The light within the first wavelength range 311 that is reflected back into the LED device 301 may re-enter the wavelength converting layer 302 to be converted to light within the second wavelength range 310. This may result in improved conversion efficiency from light within the first wavelength range 311 to light within the second wavelength range 310.

Figure 5:
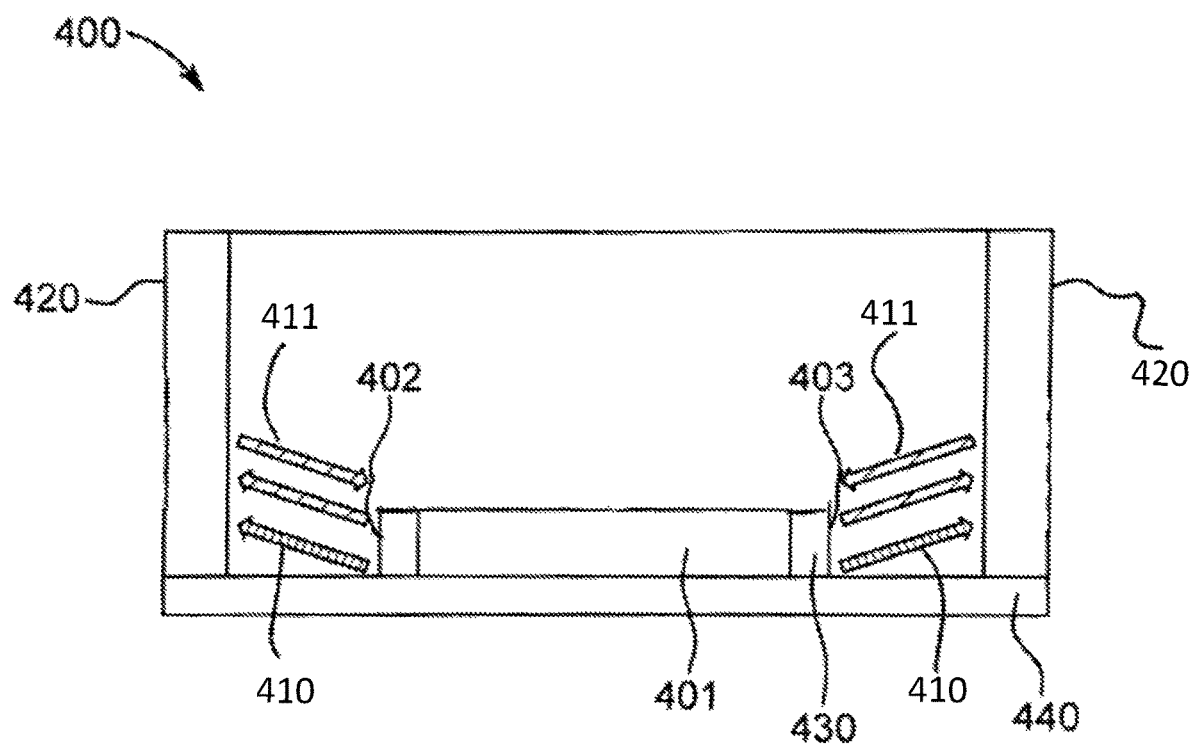
FIG. 5 is a sectional view of another example LED device that includes a dichroic mirror.

FIG. 5 illustrates an alternative embodiment of an LED device 400 comprising a light-emitting element 401. In the alternative embodiment, the light-emitting element 401 comprises a laterally emitting light-emitting element 401 and a wavelength converting layer 430 disposed adjacent sides of the light-emitting element 401. The laterally emitting light-emitting element is disposed on a support substrate 440. The laterally emitting light-emitting element 401 emits light within a first wavelength range 411. In one embodiment, the first wavelength range 411 is within the UV and/or visible portions of the spectrum. In a further embodiment, the first wavelength range 411 is approximately 350-500 nm. In a further embodiment, the light-emitting element 401 emits blue light. While not shown in FIG. 5, side surfaces and a top surface of the light-emitting element 401 that do not emit light may be covered by a material that blocks light from being emitted from those surfaces.

The wavelength converting layer 430 has characteristics which convert light within the first wavelength range 411 to light within a second wavelength range 410. The second wavelength range 410 is higher than the first wavelength range 411. In one embodiment, the second wavelength range 410 is within the IR portion of the spectrum. For example, in an embodiment where the first wavelength range 411 is approximately 350-500 nm, the second wavelength range 410 may be approximately 600-2500 nm.

The LED device 400 further comprises at least one dichroic mirror 420. The at least one dichroic mirror 420 is configured to reflect light within the first wavelength range 411 and transmit light within the second wavelength range 410. For example, in an embodiment where the first wavelength range 411 is approximately 350-500 nm and the second wavelength range 410 is approximately 600-2500 nm, the dichroic mirror 420 reflects light having a wavelength of approximately 350-500 nm and transmits light having a wavelength of approximately 600-2500 nm.

The at least one dichroic mirror 420 is placed adjacent side surfaces of the LED device 420 such that light within the first wavelength range 411 that is emitted from the light-emitting element 401 is reflected back into the LED device 400. As such, the unconverted light within the first wavelength range may be recycled back into the wavelength converting layer 430 for conversion. Light within the second wavelength range 410 is able to escape from the package, since the dichroic mirror 420 transmits light within the second wavelength range 410.

In the embodiment illustrated in FIG. 5, nearly all of the light that is emitted from the LED device 400 is emitted from a first side surface 402 of the LED structure and a second side surface 403 of the LED structure. As such, a first dichroic mirror 420 is placed adjacent to the at least one side surface 402 of the LED device 400. In the illustrated example, the LED device 400 further comprises a second dichroic mirror 420 that is adjacent a second side surface 403 of the LED device 400 and opposite the first dichroic mirror 420. Similar to the first dichroic mirror 420, the second dichroic mirror 420 is configured to reflect light within the first wavelength range 411 and transmit light within the second wavelength range 410. For example, in an embodiment where the first wavelength range 411 is approximately 350-500 nm and the second wavelength range 410 is approximately 600-2500 nm, the dichroic mirror 420 reflects light having a wavelength of approximately 350-500 nm and transmits light having a wavelength of approximately 600-2500 nm.

As illustrated in FIG. 5, the light within the first wavelength range 411 that may otherwise escape from side surfaces of the LED device 400 is reflected back into the wavelength converting layer 430 and light within the second wavelength range 410 escapes the LED device 400. This may result in improved conversion efficiency from light within the first wavelength range 411 to light within the second wavelength range 410.

While FIGS. 4 and 5 show LED devices that are purely top-emitting and two-side emitting, respectively, the embodiments described herein may apply to any type of emitter. For example, the light-emitting layer may be encapsulated on its top and side surfaces by the wavelength converting layer and the LED device may emit from the top and all side surfaces. In such an embodiment, a dichroic mirror may be designed that correspondingly covers the top and side surfaces of the LED device. Similarly, one, three and four side emitting devices are possible. In such embodiments, the wavelength converting material may encapsulate the active layer or chip on the top and side surfaces or just be disposed adjacent surfaces through which light will ultimately exit the LED device. In such embodiments, dichroic mirrors may be designed that cover one, three or four sides (e.g., one or more dichroic mirrors that form a ring or hollow cube shape) of the LED device.

In embodiments, the LED device may include a support structure for the one or more dichroic mirrors, such as a solidified, non-luminescent material, such as silicone, or a frame structure. The support structure may be dimensioned to space the dichroic mirror apart from the LED structure such that light is incident on the dichroic mirror at an appropriate angle of incidence for the dichroic mirror to efficiently reflect/transmit the desired wavelengths. One of ordinary skill in the art will understand that proper operation of the dichroic mirror may depend on the wavelength and angle of incident of light, in addition to the properties of the mirror.

Figure 6:
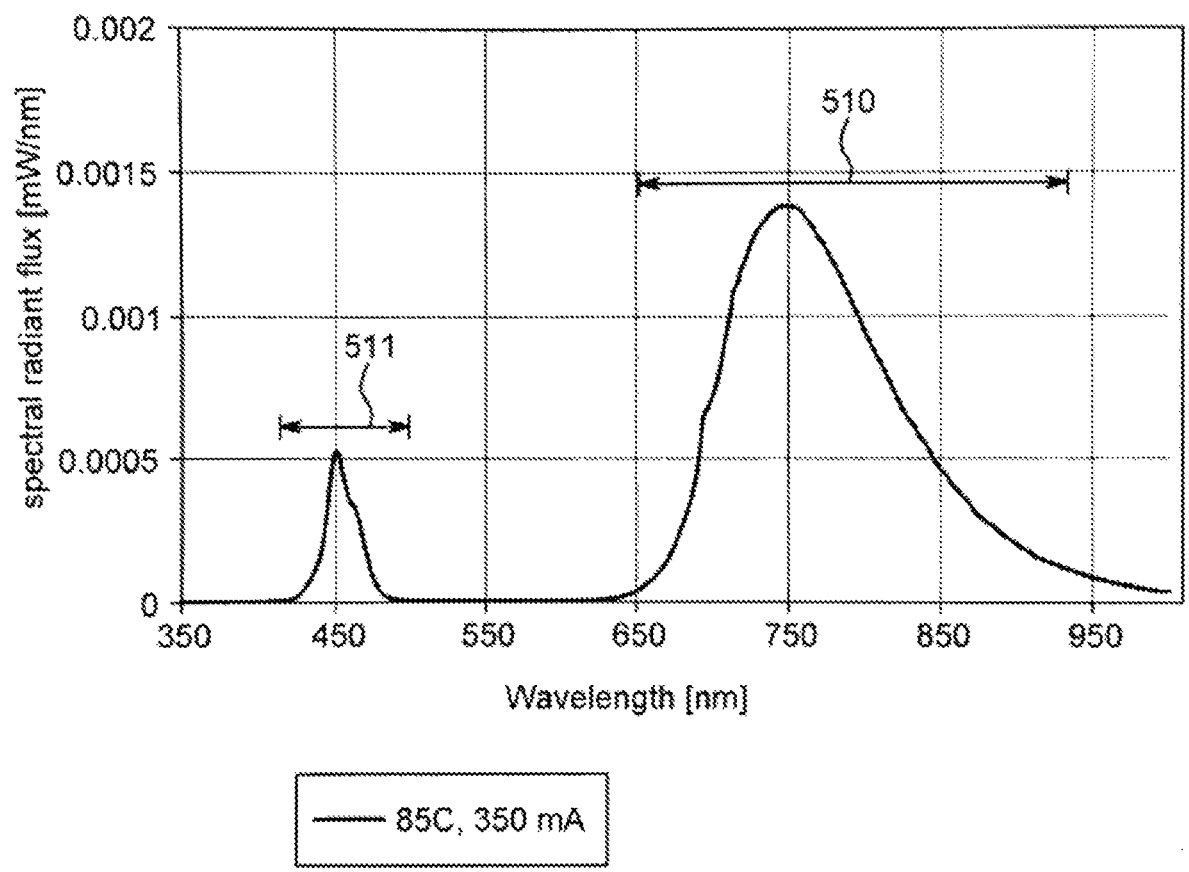
FIG. 6 is a graph showing the spectral radiant flux of light leaving an LED device with a dichroic mirror.

FIG. 6 is a graph showing the spectral radiant flux (mW/nm) of light leaving an LED device, such as described herein. As illustrated in FIG. 6, the spectral radiant flux of light within a first wavelength range 511 of approximately 350-500 nm that is emitted from the LED devices described herein is significantly less than that of the spectral radiant flux of the light within the first wavelength range 211 leaving the LED device without dichroic mirrors, as illustrated in FIG. 2. More light within a second wavelength range 510 of approximately 650 nm-1 mm is emitted from devices using dichroic mirrors, as compared to the amount of light within the second wavelength range 210 that is emitted from LED devices that do not use dichroic mirrors, as illustrated in FIG. 2. As such, the LED devices described herein that use dichroic mirrors have better efficiency and significantly reduce or eliminates the amount of unwanted light in the application.

Figure 7:
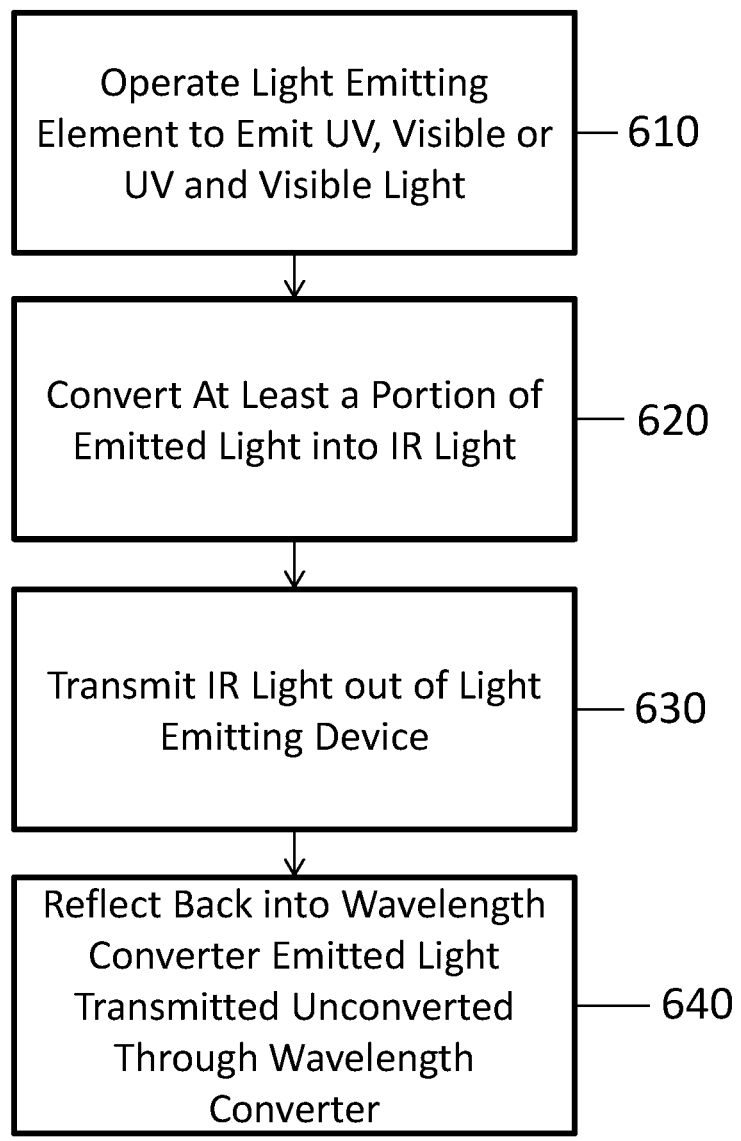
FIG. 7 shows a flow chart of a method of manufacturing an LED device with a dichroic mirror.

FIG. 7 shows a flow chart of a method of operating a device. In the example illustrated in FIG. 7, the method includes operating a light emitting element to emit ultraviolet (UV), visible, or a combination of UV and visible light (610). At least a portion of the emitted UV, visible or UV and visible light may be converted into IR light (620). The IR light may be transmitted out of the LED device (630). Emitted UV, visible or UV and visible light that is transmitted unconverted through the wavelength converter may be reflected back into the wavelength converter (640).

FIG. 8 is a diagram of an LED device 200 in an example embodiment. The LED device 200 may include a substrate 202, an active layer 204, a wavelength converting layer 206, and primary optic 208. In other embodiments, an LED device may not include a wavelength converter layer and/or primary optics.

As shown in FIG. 8, the active layer 204 may be adjacent to the substrate 202 and emits light when excited. Suitable materials used to form the substrate 202 and the active layer 204 include sapphire, SiC, GaN, Silicone and may more specifically be formed from a III-V semiconductors including, but not limited to, AlN, AlP, AlAs, AlSb, GaN, GaP, GaAs, GaSb, InN, InP, InAs, InSb, II-VI semiconductors including, but not limited to, ZnS, ZnSe, CdSe, CdTe, group IV semiconductors including, but not limited to Ge, Si, SiC, and mixtures or alloys thereof.

The wavelength converting layer 206 may be remote from, proximal to, or directly above active layer 204. The active layer 204 emits light into the wavelength converting layer 206. The wavelength converting layer 206 acts to further modify wavelength of the emitted light by the active layer 204. LED devices that include a wavelength converting layer are often referred to as phosphor converted LEDs ("PCLED"). The wavelength converting layer 206 may include any luminescent material, such as, for example, phosphor particles in a transparent or translucent binder or matrix, or a ceramic phosphor element, which absorbs light of one wavelength and emits light of a different wavelength.

The primary optic 208 may be on or over one or more layers of the LED device 200 and allow light to pass from the active layer 204 and/or the wavelength converting layer 206 through the primary optic 208. The primary optic 208 may be a lens or encapsulate configured to protect the one or more layers and to, at least in part, shape the output of the LED device 200. Primary optic 208 may include transparent and/or semi-transparent material. In example embodiments, light via the primary optic may be emitted based on a Lambertian distribution pattern. It will be understood that one or more properties of the primary optic 208 may be modified to produce a light distribution pattern that is different than the Lambertian distribution pattern.

FIG. 9 shows a cross-sectional view of a lighting system 220 including an LED array 210 with pixels 201A, 201B, and 201C, as well as secondary optics 212 in an example embodiment. The LED array 210 includes pixels 201A, 201B, and 201C each including a respective wavelength converting layer 206B active layer 204B and a substrate 202B. The LED array 210 may be a monolithic LED array manufactured using wafer level processing techniques, a micro LED with sub-500 micron dimensions, or the like. Pixels 201A, 201B, and 201C in the LED array 210 may be formed using array segmentation, or alternatively using pick and place techniques.

The spaces 203 shown between one or more pixels 201A, 201B, and 201C of the LED devices 200B may include an air gap or may be filled by a material such as a metal material which may be a contact (e.g., n-contact).

The secondary optics 212 may include one or both of the lens 209 and waveguide 207. It will be understood that although secondary optics are discussed in accordance with the example shown, in example embodiments, the secondary optics 212 may be used to spread the incoming light (diverging optics), or to gather incoming light into a collimated beam (collimating optics). In example embodiments, the waveguide 207 may be a concentrator and may have any applicable shape to concentrate light such as a parabolic shape, cone shape, beveled shape, or the like. The waveguide 207 may be coated with a dielectric material, a metallization layer, or the like used to reflect or redirect incident light. In alternative embodiments, a lighting system may not include one or more of the following: the wavelength converting layer 206B, the primary optics 208B, the waveguide 207 and the lens 209.

Lens 209 may be formed form any applicable transparent material such as, but not limited to SiC, aluminum oxide, diamond, or the like or a combination thereof. Lens 209 may be used to modify the a beam of light input into the lens 209 such that an output beam from the lens 209 will efficiently meet a desired photometric specification. Additionally, lens 209 may serve one or more aesthetic purpose, such as by determining a lit and/or unlit appearance of the p 201A, 201B and/or 201C of the LED array 210.

Having described the invention in detail, those skilled in the art will appreciate that, given the present disclosure, modifications may be made to the invention without departing from the spirit of the inventive concepts described herein. Therefore, it is not intended that the scope of the invention be limited to the specific embodiments illustrated and described.

What is claimed is:

1. A light emitting device comprising:
    a light-emitting element comprising a top surface extending in a horizontal direction and side surfaces that each extend in a vertical direction perpendicular to the horizontal direction, the light-emitting element emitting in operation a first light having a wavelength of 350 nm to 500 nm;
    a wavelength converting layer disposed in direct contact with and overlapping the top surface of the light-emitting element in the vertical direction without overlapping the side surfaces of the light-emitting element in the horizontal direction, the wavelength converting layer arranged to absorb at least a portion of the first light emitted by the light-emitting element and in response emit infrared light throughout a wavelength range of 700 nm to 1000 nm; and
    a dichroic mirror disposed above the wavelength converting layer and arranged to reflect back into the wavelength converting layer at least a portion of the first light initially transmitted unabsorbed through the wavelength converting layer so that the portion of the first light reflected back is fully absorbed by the wavelength converting layer to produce more of the infrared light, and to transmit a majority of the infrared light throughout the entire wavelength range of 700 nm to 1000 nm so that in operation a ratio of a power of the infrared light to a power of the first light in an output beam transmitted through the dichroic mirror is greater than 7:1.

2. The light emitting device of claim 1, wherein the dichroic mirror reflects light in a wavelength range of 350-500 nm.

3. The light emitting device of claim 1, wherein the dichroic mirror transmits light in a wavelength range of 700-2500 nm.

4. The light emitting device of claim 1, wherein the dichroic mirror is disposed adjacent to the wavelength converting layer opposite from at least one surface of the light-emitting element through which the first light is emitted.

5. The light emitting device of claim 4, wherein the at least one surface is at least one side surface.

6. The light emitting device of claim 5, wherein the dichroic mirror includes one or more dichroic mirrors disposed opposite the at least one side surface.

7. The light emitting device of claim 4, comprising:
    a substrate on which the light-emitting element is disposed, the at least one surface of the light-emitting element being a surface of the light-emitting element opposite the substrate.

8. The light emitting device of claim 4, comprising:
    a substrate on which a first surface of the light-emitting element is disposed, the at least one surface of the light-emitting element being all surfaces of the light emitting element other than the first surface.

9. The light emitting device of claim 8, wherein the dichroic mirror is one or more mirrors that completely surround all surfaces of the light-emitting element except the first surface.

10. The light emitting device of claim 9, wherein the dichroic mirror is a single-layer dichroic mirror having one of a ring shape and a hollow cube-shape.

11. The light emitting device of claim 1, further comprising a support structure on or adjacent to the dichroic mirror is disposed.

12. The light emitting device of claim 11, wherein the support structure comprises at least one of a non-luminescent solid material or a frame.

13. The light emitting device of claim 1, wherein the wavelength converting layer is a same width in the horizontal direction as the light-emitting element.

14. The light emitting device of claim 1, wherein the wavelength converting layer has a smaller height in the vertical direction than the light-emitting element.

15. The light emitting device of claim 1, wherein the dichroic mirror has a greater width in the horizontal direction than the wavelength converting layer and the light-emitting element.

16. The light emitting device of claim 1, wherein the wavelength converting layer comprises a first top surface extending in the horizontal direction and two side surfaces extending in the vertical direction, and the dichroic mirror comprises a second top surface extending in the horizontal direction and two side surfaces extending in the vertical direction.

17. The light emitting device of claim 1, wherein the dichroic mirror is not in direct contact with the wavelength converting layer.

18. The light emitting device of claim 1, wherein the dichroic mirror is configured to reflect a majority of total light considered throughout an entire wavelength range of 400-650 nm.

19. The light emitting device of claim 1, wherein the dichroic mirror is configured to reflect nearly all of total light considered throughout an entire wavelength range of 400-650 nm and transmit nearly all of the total light considered throughout the entire wavelength range of 700-1000 nm.

20. A light emitting device comprising:
a light-emitting element comprising a top surface and sidewalls perpendicular to the top surface, the light-emitting element in operation emitting first light within a first wavelength range; and
a wavelength converting layer disposed adjacent to the sidewalls of the light-emitting element and arranged to convert the first light within the first wavelength range to a second light within a second wavelength range, the second wavelength range being higher than the first wavelength range; and
a first dielectric mirror and a second dielectric mirror each disposed adjacent to respective one of the sidewalls of the light-emitting element without covering the top surface of the light-emitting element, such that the first dielectric mirror and the second dielectric mirror are arranged in an optical path of light emitted by or transmitted through the wavelength converting layer and are arranged to reflect the first light within the first wavelength range and transmit the second light within the second wavelength range.

* * * * *